(12) United States Patent
Enzmann et al.

(10) Patent No.: US 9,705,057 B2
(45) Date of Patent: Jul. 11, 2017

(54) METHOD FOR PRODUCING A LASER DIODE, MOUNT AND LASER DIODE

(71) Applicant: OSRAM Opto Semiconductors GmbH, Regensburg (DE)

(72) Inventors: Roland Enzmann, Regensburg (DE); Stephan Haneder, Regensburg (DE); Tomasz Swietlik, Regensburg (DE); Christoph Walter, Regensburg (DE); Andreas Rozynski, Regensburg (DE); Markus Graul, Wilhelmsdorf (DE); Karsten Auen, Regensburg (DE); Jürgen Dachs, Baar-Ebenhausen (DE)

(73) Assignee: OSRAM Opto Semiconductors GmbH, Regensberg (DE)

( * ) Notice: Subject to any disclaimer, the term of this patent is extended or adjusted under 35 U.S.C. 154(b) by 74 days.

(21) Appl. No.: 14/424,688

(22) PCT Filed: Aug. 27, 2013

(86) PCT No.: PCT/EP2013/067679
§ 371 (c)(1),
(2) Date: Feb. 27, 2015

(87) PCT Pub. No.: WO2014/033106
PCT Pub. Date: Mar. 6, 2014

(65) Prior Publication Data
US 2015/0228871 A1 Aug. 13, 2015

(30) Foreign Application Priority Data

Aug. 28, 2012 (DE) .................. 10 2012 215 265

(51) Int. Cl.
*H01S 5/022* (2006.01)
*H01L 33/60* (2010.01)
(Continued)

(52) U.S. Cl.
CPC ............ *H01L 33/60* (2013.01); *H01L 33/005* (2013.01); *H01L 33/48* (2013.01); *H01L 33/62* (2013.01);
(Continued)

(58) Field of Classification Search
CPC ................. H01S 5/0286; H01S 5/0425; H01S 2933/0016; H01S 2933/0025
See application file for complete search history.

(56) References Cited

U.S. PATENT DOCUMENTS 4,798,439 A * 1/1989 Preston ................ G02B 6/4238
257/734
5,185,290 A * 2/1993 Aoyagi ................... H01L 33/44
148/DIG. 95

(Continued)

FOREIGN PATENT DOCUMENTS

DE 102010015197 A1 1/2012
DE 102010043693 A1 3/2012
(Continued)

*Primary Examiner* — Joshua King
(74) *Attorney, Agent, or Firm* — Slater Matsil, LLP

(57) ABSTRACT

In a method for producing a laser diode, a number of laser diodes are produced on a wafer. The wafer is broken down into wafer pieces, each wafer piece having a plurality of laser diodes being arranged side by side. One wafer piece is inserted into a first mount that includes a first covering element overlapping a front face of the wafer piece and shadowing a bottom area of the front face of the wafer piece. A minor layer is deposited on an unshadowed upper area of the wafer piece's front face. The wafer piece is inserted into a second mount, which includes a second covering element that shadows the minor layer of the upper area of the front face. An electrically conductive contact layer is deposited on an unshadowed bottom area of the wafer piece's front face. The wafer piece is subsequently broken down into individual laser diodes.

8 Claims, 5 Drawing Sheets

(51) Int. Cl.
*H01S 5/028* (2006.01)
*H01L 33/00* (2010.01)
*H01L 33/48* (2010.01)
*H01L 33/62* (2010.01)
*H01S 5/02* (2006.01)

(52) U.S. Cl.
CPC .......... H01S 5/028 (2013.01); H01S 5/02252 (2013.01); H01S 5/02268 (2013.01); *H01L 2933/0033* (2013.01); *H01L 2933/0058* (2013.01); *H01L 2933/0066* (2013.01); *H01S 5/0201* (2013.01); *H01S 5/0217* (2013.01)

(56) References Cited

U.S. PATENT DOCUMENTS

| | | | | |
|---|---|---|---|---|
| 5,430,750 | A * | 7/1995 | Tanimoto | H01S 5/028 372/49.01 |
| 5,989,932 | A | 11/1999 | Freund et al. | |
| 7,021,838 | B2 * | 4/2006 | Massey | G02B 6/4221 385/52 |
| 8,858,030 | B2 | 10/2014 | Avramescu et al. | |
| 8,879,597 | B2 | 11/2014 | Eichler et al. | |
| 8,913,640 | B2 * | 12/2014 | Moenster | H01S 5/02272 372/34 |
| 2002/0105981 | A1 * | 8/2002 | Gen-ei | G11B 7/127 372/36 |
| 2004/0113160 | A1 * | 6/2004 | Oshima | H01S 5/028 257/82 |
| 2004/0165635 | A1 | 8/2004 | Sugimoto et al. | |
| 2008/0035935 | A1 * | 2/2008 | Shum | H01L 33/382 257/79 |
| 2008/0102546 | A1 * | 5/2008 | Ryu | B82Y 20/00 438/29 |
| 2013/0230067 | A1 * | 9/2013 | Eichler | H01S 5/0286 372/44.01 |

FOREIGN PATENT DOCUMENTS

| | | |
|---|---|---|
| DE | 102011054954 A1 | 5/2013 |
| EP | 1288687 A1 | 3/2003 |
| JP | 2004327637 A | 11/2004 |
| JP | 2005101457 A | 4/2005 |
| JP | 2007281390 A | 10/2007 |
| WO | 03044571 A2 | 5/2003 |

* cited by examiner

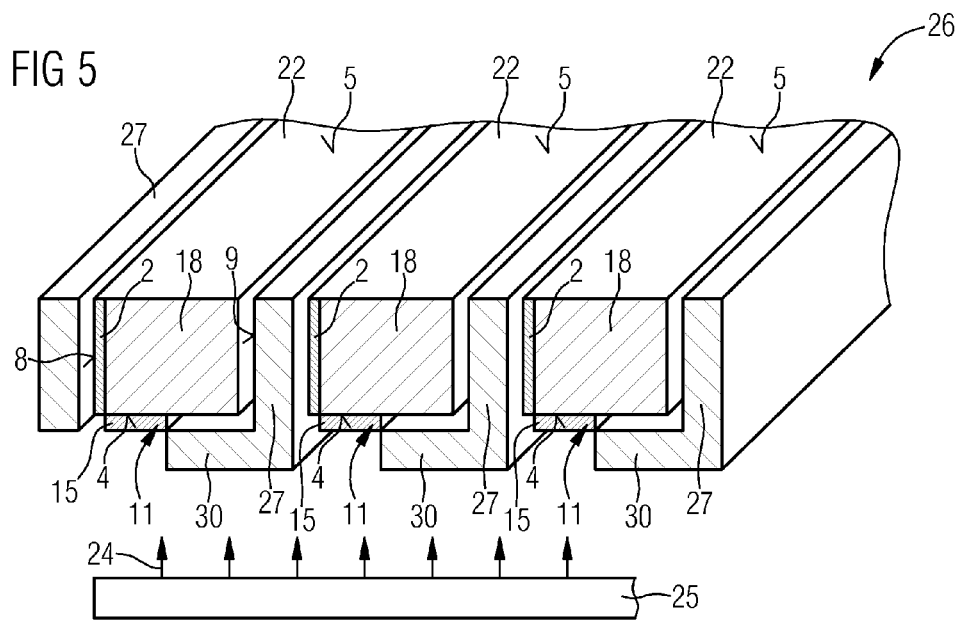
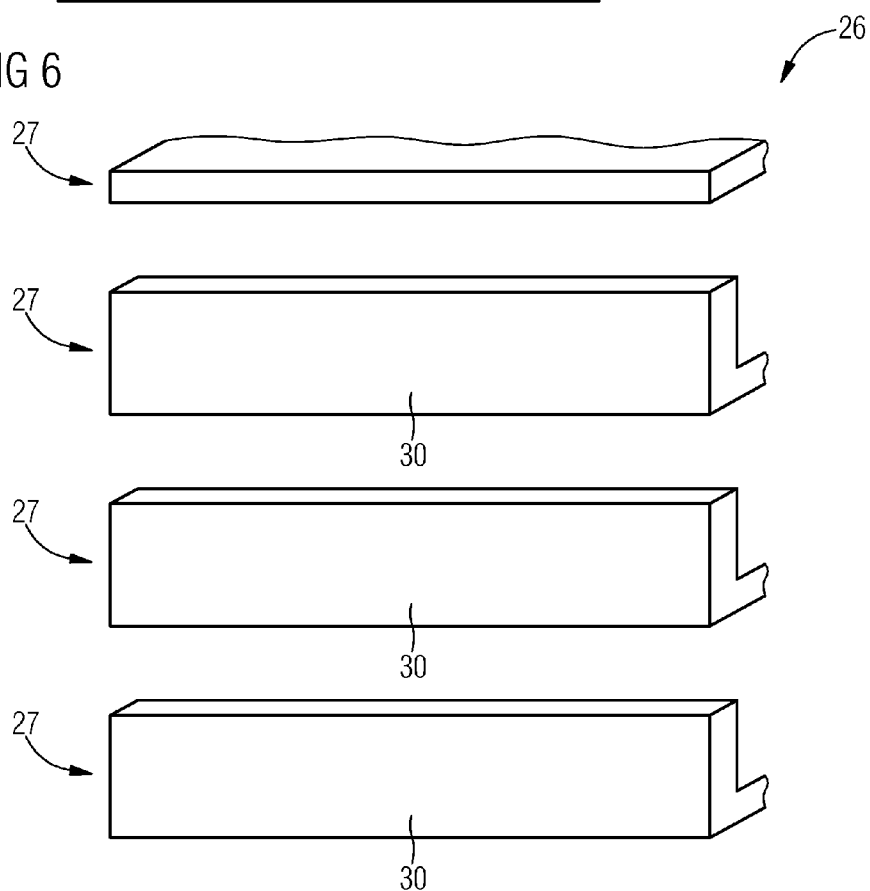

METHOD FOR PRODUCING A LASER DIODE, MOUNT AND LASER DIODE

This patent application is a national phase filing under section 371 of PCT/EP2013/067679, filed Aug. 27, 2013, which claims the priority of German patent application 10 2012 215 265.2, filed Aug. 28, 2012, each of which is incorporated herein by reference in its entirety.

TECHNICAL FIELD

The present invention relates to a method for producing a laser diode, to a mount and to a laser diode.

BACKGROUND

The prior art discloses methods for producing laser diodes on a gallium-arsenide wafer, the laser structures being deposited on the gallium-arsenide wafer, the gallium-arsenide wafer being thinned and the gallium-arsenide wafer being subsequently singularized to obtain laser bars. The laser bars are subsequently provided with a mirror layer on a front and on a back face. Thereupon, the laser bars are singularized to obtain individual laser diodes. Subsequently, the individual laser diodes are each bonded to a carrier element. The carrier element comprises a contact pad on a front face.

The described method is complex and time-consuming due to the connection between the laser diode and the carrier element. Moreover, precise adjustment of the laser diode relative to the carrier element is difficult.

SUMMARY OF THE INVENTION

Embodiments of the present invention simplifies the method for producing a laser diode having a carrier element.

Further embodiments of the present invention provide an easy-to-produce laser diode having a carrier element, the laser diode being precisely adjusted relative to the carrier element.

An advantage of the described method consists in the laser diode being produced together with the wafer piece as a carrier element in the form of an integral element. For this purpose, a laser-diode structure is deposited on the wafer. Thereby, the connecting process between the laser diode and the wafer piece involving complex adjustment may be avoided, thus allowing for inexpensive production. Moreover, the laser diode is very precisely adjusted with regard to the wafer piece. This is particularly advantageous if the wafer piece comprises an adjustment surface which is used for adjusting and/or fixing an optical component such as an optical fiber. Due to the described integral manufacturing of the laser diode with the wafer piece, expensive machine and bonding processes may be dispensed with.

The manufacturing process may be carried out in a simple and inexpensive manner by using simply configured mounts which shadow different areas of the front face of the wafer piece, the mirror layer and the contact layer being deposited on different areas of the front face of the wafer piece by utilizing the shadowing effects of the mounts.

In a further embodiment, a plurality of wafer pieces is simultaneously inserted into the first mount and the upper areas of the wafer pieces' front faces are simultaneously provided with a minor layer. This allows for inexpensive manufacturing of the laser diodes.

In a further embodiment, a plurality of wafer pieces is inserted into the second mount and the bottom areas of the wafer pieces' front faces are simultaneously provided with the contact layer. This allows for a more cost-efficient manufacturing.

In a further embodiment, damage to the wafer pieces' front face may be prevented by the covering elements of the retaining elements overlapping the wafer pieces' front face without the first or, respectively, the second mount resting on the wafer pieces' front faces. For this purpose, the mirror layer and/or the contact layer are deposited, particularly by vapour deposition, onto the wafer pieces' front face at a predetermined angle in a slanted manner with regard to the covering elements of the first and/or the second mount by means of a directed deposition technique.

In a further embodiment, the wafer is thinned from the bottom face prior to cleaving it into wafer pieces, particularly to a thickness larger than 100 µm and less than 500 µm. Thereby, the method is further simplified as separating a thin wafer into wafer pieces may be carried out in a faster and simpler manner.

In a further embodiment, the back face of the wafer piece is provided with a further minor layer while the wafer piece is held in the first or in the second mount. This further simplifies the method.

For a cost-efficient and simple method, a mount is used in which a plurality of wafer pieces may be held, the wafer pieces being held in the mount at opposite end sections, wherein the wafer pieces each comprise at least one laser diode, opposite lateral faces of the wafer piece being opposite front and back faces of the laser diode, wherein the mount comprises a covering layer, the covering layer covering a part of a front face of the laser diode. Thus, the described method may be carried out in a simple and inexpensive manner.

In a further embodiment, the mount is configured to hold a plurality of wafer pieces. Thus, the deposition techniques for the front and back face may be carried out simultaneously for a plurality of wafer pieces. This allows for inexpensive manufacture.

BRIEF DESCRIPTION OF THE DRAWINGS

The above-described properties, features and advantages of the present invention as well as the manner in which they are achieved will become clearer in context with the following description of the embodiment examples which are described in conjunction with the accompanying drawings, in which

FIG. 5 depicts a schematic cross-sectional view through a third mount with mounted wafer pieces;

FIG. 6 shows a front view of the third mount;

DETAILED DESCRIPTION OF ILLUSTRATIVE EMBODIMENTS

Figure 1:
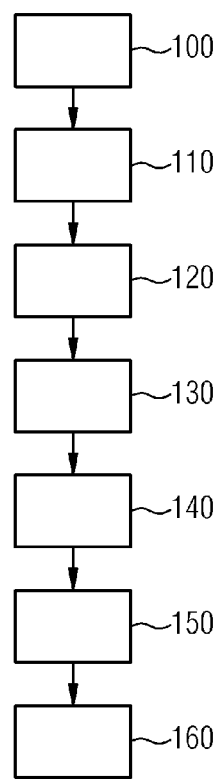
FIG. 1 shows a schematic program sequence for carrying out the method.
Figure 2:
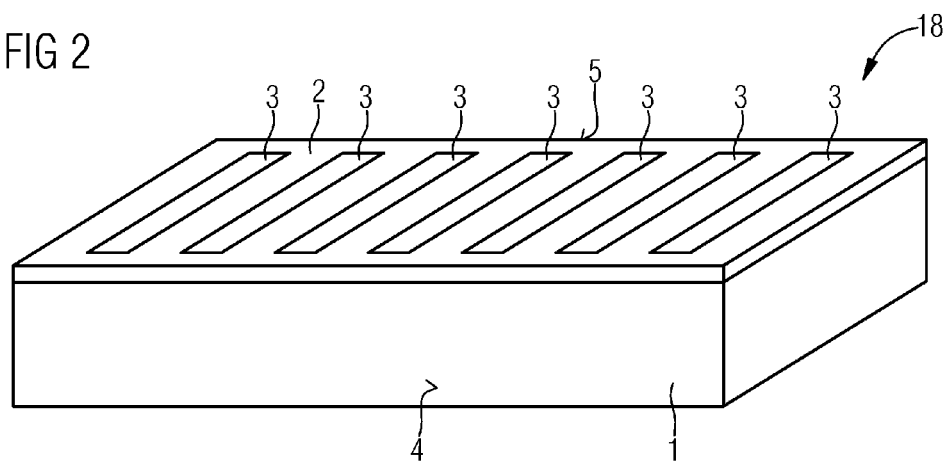
FIG. 2 depicts a schematic view of a wafer piece.

FIG. 1 shows a schematic program sequence for carrying out a method for manufacturing laser diodes. The laser diode may comprise a laser-diode structure comprising, e.g., a Ridge waveguide. In program step 100, the laser-diode structures are deposited on the upper surface of a wafer, e.g., a gallium-arsenide wafer with an active pn-layer. On the laser-diode structures, first electrical contacts for a plurality of laser diodes are arranged side-by-side. Subsequently, the wafer is mechanically thinned in a subsequent program step 110. Therein, e.g., a chemical-mechanical polishing process is used to reduce the wafer thickness from the bottom face to a range of 100 to 500 µm. In a following method step 120, the wafer is singularized into wafer pieces having a plurality of laser diodes, which are referred to as laser bars (FIG. 2).

Figure 3:
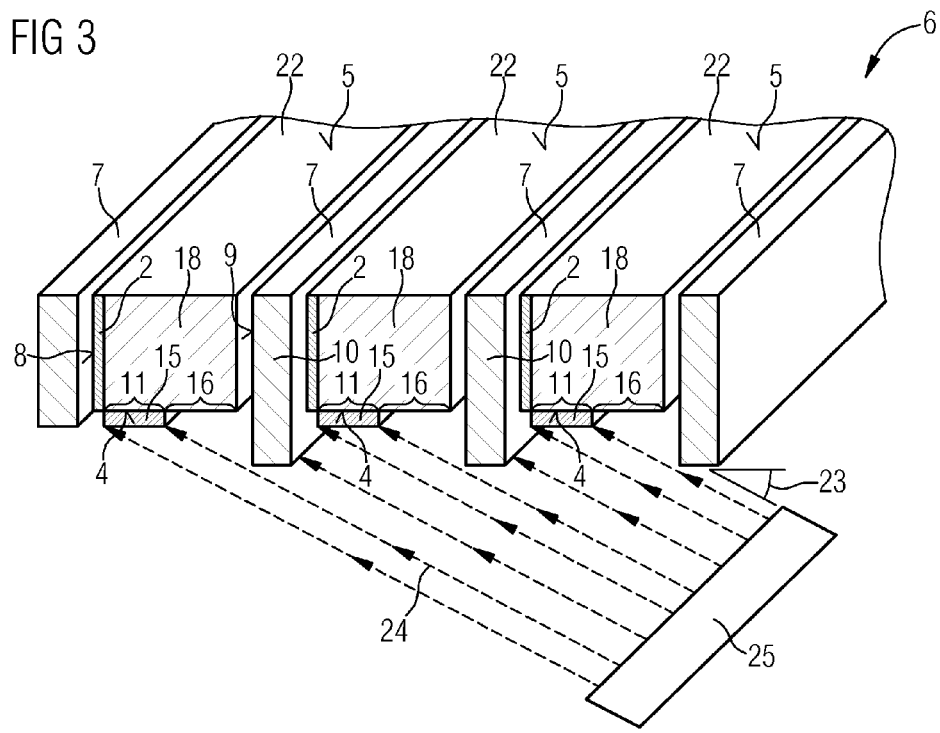
FIG. 3 shows a schematic cross-sectional view through a first mount with mounted wafer pieces.

Subsequently, in a method step 130, the laser bars are inserted into a first mount. The first mount comprises a covering element which respectively covers and particularly shadows a front face of the laser bar in a bottom area which is at the same time the front side of the laser diodes, i.e. a coupling-out face, and leaves an upper area provided for a mirror layer uncovered or, respectively unshadowed (FIG. 3). Subsequently, in a method step 140, the minor layer is deposited on the upper un-shadowed areas of the front faces of the laser bars. In addition, a further minor layer may simultaneously be deposited on the back side of the laser bars for the back face.

As the back face serves no further purpose in the described embodiment, the entire back face may be provided with the minor layer. As a result, the process is simplified as it is not necessary to partially cover the back face of the laser bars.

Figure 4:
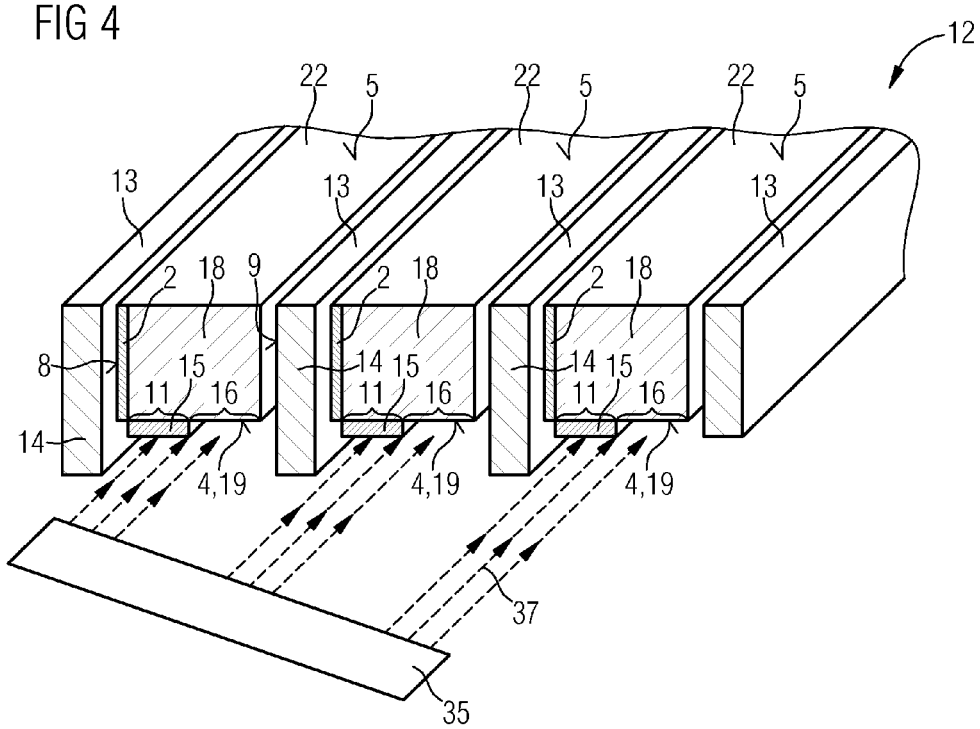
FIG. 4 shows a schematic cross-sectional view through a second mount with mounted wafer pieces.

After depositing the minor layer on the upper area of the front face of the laser bars, the laser bars are taken from the first mount in a method step 150 and are inserted into a second mount (FIG. 4).

In the second mount, the deposited mirror layer is covered or, respectively, shadowed by a second covering element of the second mount and a bottom area of the front face of the laser bars is not shadowed. Subsequently, an electrical contact layer is deposited on the free bottom area of the front face. The electrical contact layer may, e.g., be configured as a titan-platinum-gold layer sequence.

Figure 9:
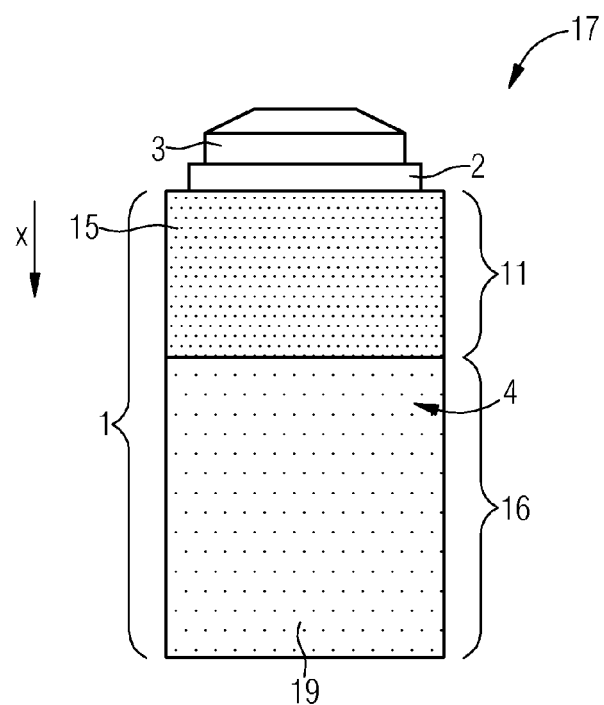
FIG. 9 shows a schematic view of a front view of a laser diode.

Subsequently, the laser bars are taken from the second mount in a method step 160 and singularized to obtain individual laser diodes (FIG. 9).

FIG. 2 shows a laser bar 18, the laser bar 18 being configured as a piece 1 of a wafer on which a laser-diode structure 2 comprising a plurality of laser diodes has respectively been deposited. On the top surface of the laser-diode structure 2, an electrically conductive first contact 3 has been deposited for each single laser diode. The first electrical contacts 3 have a strip-like configuration. The laser bar 18 comprises a front face 4 which corresponds to the front face of the laser-diode structure from which the light generated by the laser diode is to be coupled out. In addition, the laser bar 18 comprises a back face 5 corresponding to the back side of the laser-diode structures. FIG. 2 shows a laser bar 18 according to the method sequence of FIG. 1 after method step 120.

FIG. 3 shows a schematic cross-section through the first mount 6, the first mount 6 comprising first retaining elements 7 which the inserted laser bars 18 touch with a top surface and a bottom surface 8, 9. Thus, the retaining elements 7 serve as retaining means for holding the laser bars in the first mount 6. Moreover, the first retaining elements 7 each comprise first covering elements 10 overlapping the front faces 4 of the laser bars 18. Thus, the upper area 11 of the front faces 4 of the laser bars is freely and directly accessible from the front. In the upper area 11, the laser-diode structures 2 of the laser diodes are arranged.

The arrangement depicted schematically in FIG. 3 corresponds to the method sequence according to method step 130 of FIG. 1. A mirror layer 15 for the front face of the laser diodes is now arranged on the upper area 11 of the front face 4 of the laser bars 18. For this purpose, as schematically indicated in FIG. 3, the mirror layer 15 is deposited, particularly by vapor deposition, in a directed deposition process in which the material flow 24 is aligned with regard to the overlapping first covering elements 10 at a predefined angle. FIG. 3 shows the direction of the material flow as arrows. Due to a shadowing effect caused by the first covering elements 10, only the upper area 11 of the front face 4 of the laser bars 18 is provided with the minor layer 15. The other area of the front face 4 of the laser bars 18 is covered by the overlapping first covering elements 10 during deposition of the mirror layer 15 and is thus not provided with a minor layer 15. The size of the upper area may, e.g., be set by the angle 23 at which the material flow 24 impacts the cover 10.

The minor layer 15 is permeable for a predetermined portion, e.g., more than 90%, of the laser radiation. The back face of the laser bars 18 is freely accessible so that a further minor layer 22 may simultaneously be deposited on the back face. The minor layer of the back face is essentially impermeable for the laser radiation.

FIG. 4 shows a schematic view of a second mount 12 having second retaining elements 13. The second retaining element 12 comprises second retaining elements 13 which hold the laser bars 18 to the corresponding top surfaces 8 and bottom surfaces 9. Thus, the second retaining elements 13 provide retaining means for holding the laser bars at the second mount 12. Moreover, the second retaining elements 13 comprise second covering elements 14 overlapping the front faces 4 of the laser bars 18. The entire front face 4 is freely accessible from the front side in a perpendicular manner. The second mirror layer 22 has already been deposited on the back face of the laser bars 18. On the bottom area 16 of the front face 4 of the laser bars 18, the contact layer 19 is deposited, e.g., in three layers of titanium, platinum and gold. For this purpose, as schematically indicated in FIG. 4, the contact layer 19 is deposited, particularly vaporized, at a predefined angle 23 with regard to the overlapping second covering elements 14 by means of a second material flow 37 coming from a second material source 35 in a directed second deposition process 24. Due to a shadowing effect caused by the second covering elements 14, the contact layer 19 is only deposited on the bottom area 16 of the front face 4 of the laser bars 18. The upper area 11 of the front face 4 of the laser bars 18 is shadowed when depositing the contact layer 19 and thus not provided with a contact layer 19. The size of the bottom area may be set by the angle 23 during deposition. FIG. 4 shows an arrangement after carrying out method step 150 of FIG. 1. Subsequently, the laser bars 18 are taken from the second mount 12 and singularized to obtain individual laser diodes.

FIG. 5 shows a schematic cross-section through a third mount 26, the third mount 26 comprising third retaining elements 27 which touch a top surface and a bottom face 8, 9 of the inserted laser bars 18. Furthermore, the third mounts 27 comprise third covering elements 30 covering the front face 4 of the laser bar 18 in a bottom area. The third covering elements 30 are arranged at an angle with regard to the third retaining elements 27 and run in parallel to the front face 4 of the laser bars 18. Thus, an upper area 11 of the front face 4 of the laser bars 18 is freely accessible. In the upper area 11, the laser-diode structures 2 of the laser diodes are arranged. The arrangement shown schematically in FIG. 5 corresponds to the method according to method step 130 of FIG. 1. The minor layer 15 is now deposited on the free upper area 11 of the front face 4 of the laser bars 18. In this embodiment, the minor layer is deposited by means of a material flow 24 which is directed perpendicularly onto the front faces 4 of the laser bars 18. Moreover, the back face of the laser bars 18 is freely accessible, as well, so that a further mirror layer 22 may simultaneously be deposited on the back face.

FIG. 6 schematically depicts the front view of the third mount 26.

Figure 7:
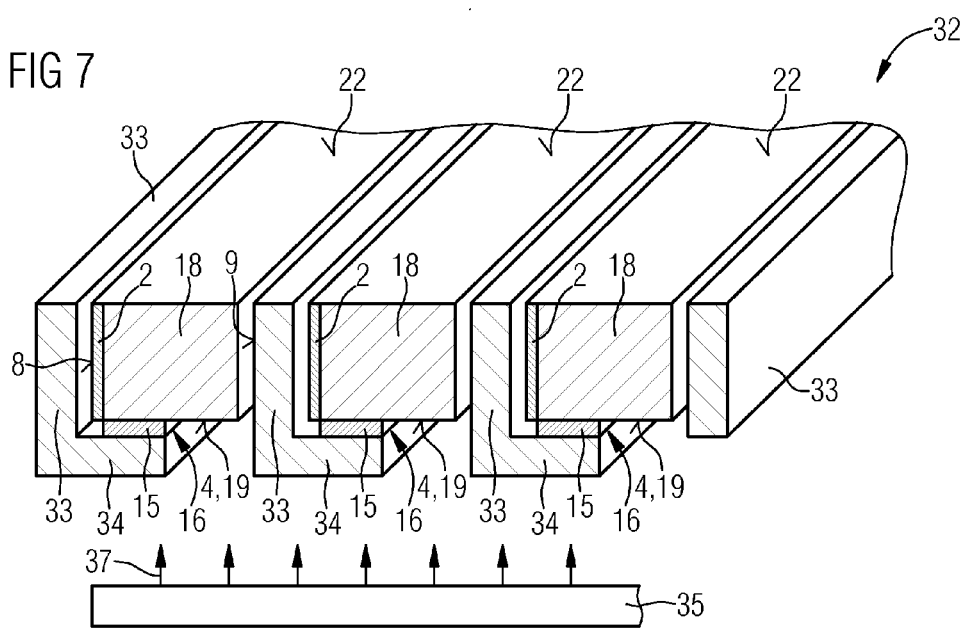
FIG. 7 depicts a schematic cross-sectional view of a fourth mount with mounted wafer pieces.

FIG. 7 shows a schematic view of a fourth mount 32 having fourth retaining elements 33. The fourth retaining elements 33 hold the laser bars 18 at corresponding top surfaces 8 and bottom surfaces 9. Moreover, the fourth retaining elements 13 comprise fourth covering elements 34 which cover the upper area 11 by means of the already deposited mirror layer 15. The fourth covering elements 34 are arranged at an angle with regard to the fourth retaining elements 33 and run in parallel to the front face 4. The bottom area 16 of the front face 4 of the laser bars 18 is freely accessible. The further mirror layer 22 has already been deposited on the back face of the laser bars 18.

On the free bottom area 16 of the front face 4 of the laser bars 18, the contact layer 19 is deposited. In this embodiment, the contact layer is deposited by means of a second material flow 37 which is perpendicularly directed onto the front faces 4 of the laser bars 18. FIG. 7 depicts an arrangement upon carrying out method step 150 of FIG. 1. Subsequently, the laser bars 18 are taken from the second mount 12 and singularized to obtain individual laser diodes 17.

Figure 8:
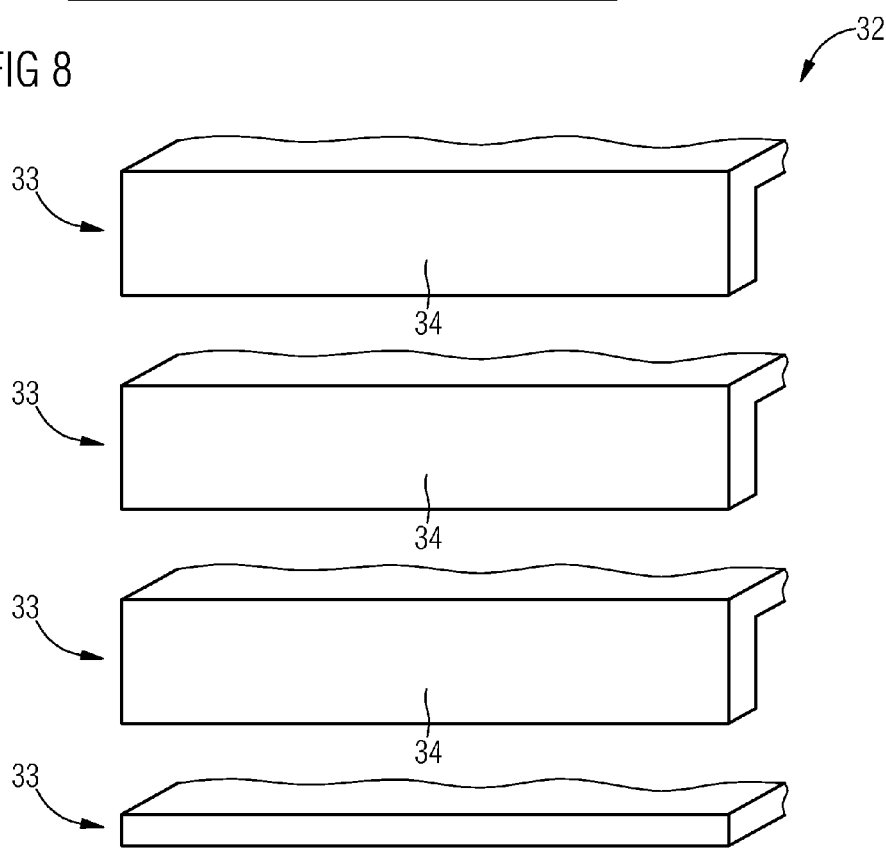
FIG. 8 shows a front view of the fourth mount.

FIG. 8 depicts a schematic front view of the second mount.

FIG. 9 depicts a laser diode 17 manufactured and singularized in accordance with the described method in a view onto the front face 4. The laser diode 17 is integrally configured from a wafer piece 1 on which the laser-diode structure 2 has been deposited. On the top surface of the laser-diode structure 2, the first electrical contact 3 is deposited. The upper area 11 of the front face 4 of the laser diode 17 comprises the mirror layer 15. The bottom area 16 of the front face 4 of the laser diode 17 comprises the electrical contact layer 19 which is a further electrical contact of the laser diode 17.

Due to the integral configuration and the employed methods for manufacturing the laser-diode structure 2 and the singularizing of the laser diodes 17, the contact layer 19 has a very precise alignment with regard to the laser-diode structure 2. In addition, the contact layer 19 is precisely aligned with respect to the front face 4 of the laser-diode structure 2. As a result, the contact layer 19 may be used as an adjustment layer for precise mounting and/or electrical contacting and fixing of an optical component such as an optical fiber.

The p-n-layer sequence of the laser-diode structure 2 runs in the x-direction, the p-layer being assigned to the first contact 3 and the n-layer being assigned to the wafer piece 1.

Figure 10:
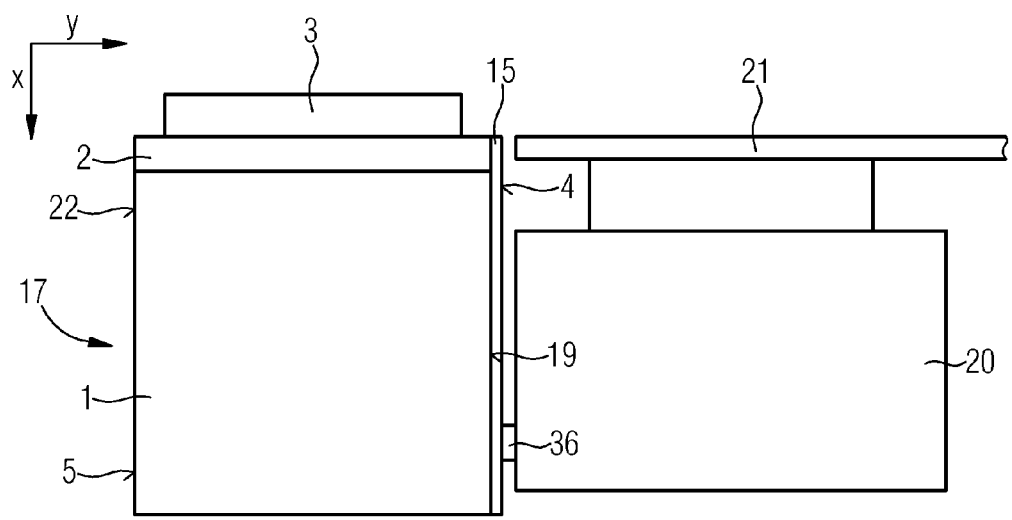
FIG. 10 depicts a schematic view of a lateral view of a laser diode having an optical component.

FIG. 10 shows a schematic view of the laser diode 17, an optical component being mounted and/or electrically contacted as an optical fiber 21 at the surface of the contact layer 19. Thereby, precise alignment of the optical component with regard to the laser-diode structure 2 is achieved. In addition, the laser diode 17 may be contacted via corresponding contacts 36 or, respectively, electrical conductors of the further carrier element and provided with current for operation.

The optical component comprises a further carrier element 20 to which an optical fiber 21 is fixed. By the abutment of the further carrier element 20 at the contact layer 19, a precise alignment of the optical fiber 21 with regard to the coupling-out surface, i.e. the front face of the laser-diode structure 2 is achieved. The direction of oscillation of the laser radiation in the laser-diode structure is aligned along the y-axis.

In addition, the contact layer 19 may be used in order to connect a second electrical contact 36 to the laser diode 17. This may, e.g., be carried out via the optical component or by means of a separate electrical contact.

In spite of the present invention being depicted and described in more detail in conjunction with the preferred embodiment example, the present invention is not limited by the disclosed examples and the person skilled in the art may devise other variants therefrom without exceeding the scope of the present invention.

The invention claimed is:

1. A method for producing a laser diode, the method comprising:
   forming a plurality of laser diodes on a wafer;
   separating the wafer into wafer pieces, each wafer piece comprising a plurality of laser diodes arranged side by side;
   inserting one wafer piece into a first mount, the first mount comprising a first covering element overlapping a front face of the wafer piece and shadowing a bottom area of the front face of the wafer piece;
   depositing a mirror layer only on an unshadowed upper area of the front face of the wafer piece;
   inserting the wafer piece into a second mount, the second mount comprising a second covering element, the second covering element shadowing the mirror layer of the upper area of the front face;
   depositing an electrically conductive contact layer on an unshadowed bottom area of the front face of the wafer piece; and
   separating the wafer piece into individual laser diodes.

2. The method according to claim 1, wherein the covering elements of the first and second mount overlap the front face of the wafer piece in a straight-lined manner, the mirror layer and the electrically conductive contact layer being deposited by a directed depositing process.

3. The method according to claim 2, wherein the mirror layer and the electrically conductive contact layer are deposited using vapor deposition.

4. The method according to claim 1, wherein a plurality of wafer pieces is inserted into the first mount and the upper areas of the front faces of the wafer pieces are simultaneously provided with a mirror layer.

5. The method according to claim 1, wherein a plurality of wafer pieces is inserted into the second mount and the bottom areas of the front faces of the wafer pieces are simultaneously provided with the electrically conductive contact layers.

6. The method according to claim 1, further comprising thinning the wafer from a bottom face prior to separating the wafer into the wafer pieces.

7. The method according to claim 6, wherein the wafer is thinned to a thickness of more than 100 µm and less than 500 µm.

8. The method according to claim 1, further comprising forming a mirror layer over a back face of the wafer piece while the wafer piece is held in the first mount or in the second mount, the back face opposite the front face.

* * * * *